United States Patent [19]
Honma et al.

[11] Patent Number: 5,837,594
[45] Date of Patent: Nov. 17, 1998

[54] METHOD OF MANUFACTURING A SEMICONDUCTOR DEVICE WHEREIN ONE OF CAPACITOR ELECTRODES COMPRISES A CONDUCTOR POLE AND A TRAY-SHAPED CONDUCTOR LAYER

[75] Inventors: Ichiroh Honma; Hirohito Watanabe, both of Tokyo, Japan

[73] Assignee: NEC Corporation, Tokyo, Japan

[21] Appl. No.: 868,582

[22] Filed: Jun. 4, 1997

Related U.S. Application Data

[62] Division of Ser. No. 710,939, Sep. 24, 1996, Pat. No. 5,753,949.

[30] Foreign Application Priority Data

Sep. 29, 1995  [JP]  Japan ..................... 8-710939

[51] Int. Cl.$^6$ ............... H01L 21/20; H01L 21/8242
[52] U.S. Cl. ............... 438/396; 438/253; 438/254; 438/397
[58] Field of Search ............... 438/253, 254, 438/396, 397; 257/308

[56] References Cited

U.S. PATENT DOCUMENTS

| | | | |
|---|---|---|---|
| 5,137,842 | 8/1992 | Chan et al. | 438/396 |
| 5,389,560 | 2/1995 | Park | 438/396 |
| 5,432,116 | 7/1995 | Keum et al. | 438/396 |
| 5,482,886 | 1/1996 | Park et al. | 438/396 |
| 5,508,222 | 4/1996 | Sakao | 438/396 |
| 5,543,346 | 8/1996 | Keum et al. | 438/396 |
| 5,550,076 | 8/1996 | Chen | 438/396 |
| 5,753,949 | 5/1998 | Honma et al. | 257/309 |

FOREIGN PATENT DOCUMENTS

| | | |
|---|---|---|
| 4430771 | 3/1995 | Germany . |
| 4430963 | 3/1995 | Germany . |
| 4-264767 | 9/1992 | Japan . |
| 6-37271 | 2/1994 | Japan . |
| 6-181188 | 6/1994 | Japan . |

OTHER PUBLICATIONS

H. Watanabe, et al., "Hemispherical Grained Si Formation on in situ Phosphorus Doped Amorphous–Si Electrode for 256Mb DRAM's Capacitor", 8093 IEEE Transactions on Electron Devices 42(1995) Jul., No. 7, pp. 1247–1253.

*Primary Examiner*—Charles L. Bowers, Jr.
*Assistant Examiner*—Toniae M. Thomas
*Attorney, Agent, or Firm*—Sughrue, Mion, Zinn, Macpeak & Seas, PLLC

[57] ABSTRACT

Used nearer to a MOS transistor (25, 29(1), 29(2)) together with another capacitor electrode (39) with a dielectric film (37) interposed for use in a DRAM, a capacitor electrode is manufactured to include a conductor pole (53) and a tray-shaped conductor layer (55) which is held by the conductor pole and to include a plate portion (57) extended perpendicular to a pole axis and having a plate periphery and a peripheral portion (59) extended parallel to the pole axis from the plate periphery towards a pole end. Preferably, the tray-shaped conductor layer is held by the pole on a plurality of levels. A planar conductor layer may additionally be held at the pole end perpendicular to the pole axis. Word (41) and bit (49) lines are embedded in an insulator layer (43, 51) for the capacitor and the transistor.

5 Claims, 10 Drawing Sheets

METHOD OF MANUFACTURING A SEMICONDUCTOR DEVICE WHEREIN ONE OF CAPACITOR ELECTRODES COMPRISES A CONDUCTOR POLE AND A TRAY-SHAPED CONDUCTOR LAYER

This is a divisional of application Ser. No. 08/710,939 filed Sep. 24, 1996; now U.S. Pat. No. 5,753,949.

BACKGROUND OF THE INVENTION

This invention relates to a semiconductor device comprising a capacitor which is for use in particular in a memory cell of a DRAM (dynamic random access memory). This invention relates furthermore to a semiconductor device manufacturing method of manufacturing such a semiconductor device.

In a DRAM of a simplest possible structure, a memory cell comprises a transfer transistor and a capacitor connected to the transistor. This structure is capable of providing a highly integrated device and is therefore widely in use. On achieving a higher degree of integration, the capacitor must not occupy a wide area on the semiconductor device. On the other hand, the capacitor must have a sufficiently great capacitance in order to make the DRAM stably operable and have a high reliability. The semiconductor device is consequently given a three-dimensional structure.

Among DRAM memory cells of the three-dimensional structure, a stacked type is strong against alpha-ray radiations and circuit noise and is stably operable even when the capacitor has a relatively small capacitance. As a consequence, the stacked type is preferred to a trench type and is believed effective for use in a DRAM of a memory capacity of 1 Gb in which the semiconductor device is of a 0.15-micron design rule.

In a DRAM memory cell of the stacked type, the transfer transistor is manufactured along a principal surface of a semiconductor substrate. The capacitor comprises a first or lower capacitor electrode, a second or upper capacitor electrode, and a capacitor dielectric film between the first and the second capacitor electrodes.

In recent capacitors of the type described, the first capacitor electrode is composed of a plurality of concentric circular cylindrical conductor layers. By way of example, a conventional DRAM memory cell will be described more in detail later according to Japanese Patent Prepublication (A) No. 264,767 of 1992. In this patent prepublication, a semiconductor device manufacturing method is also disclosed. It should be noted in this connection that a DRAM memory cell must comprise a word line and a bit line, which are nevertheless not described in the patent prepublication.

When such capacitors are used in a DRAM of 256 Mb or of 1 Gb, the concentric circular cylindrical conductor layers must be made of a very thin conductor film. Moreover, a semiconductor device comprises peripheral circuitry for the DRAM memory cell or for an array of DRAM memory cells. When given an appreciable capacitance in a narrow capacitor area, the capacitor must be thick, namely, have a considerable height. This results in a step in the semiconductor device between the capacitor or capacitors and the peripheral circuitry. The second capacitor electrode must be stepped. It would be necessary for the second capacitor electrode to afford a novel conductor material which is mechanically strong and can well cover the step. This is, however, very difficult at present. Furthermore, the step renders it difficult to overlay a wiring pattern on the second capacitor electrode because the art of lithography for the pattern results in a narrow focusing margin and in deterioration of resolution which undesirably give rise to breakage and short circuitry in the pattern.

SUMMARY OF THE INVENTION

It is consequently a principal object of the present invention to provide a semiconductor device having a capacitor which includes first and second capacitor electrodes with a capacitor dielectric film interposed there between and which has a wide effective area of the first capacitor electrode, to thereby provide a great capacitance occupying a small capacitor area.

It is another principal object of this invention to provide a semiconductor device which is of the type described and in which the capacitor is mechanically strong.

It is still another principal object of this invention to provide a semiconductor device which is of the type described and in which no distinct step is necessary between the capacitor and peripheral circuitry formed therein.

It is yet another principal object of this invention to provide a semiconductor device which is of the type described and which is made of a commonly available conductor material.

It is a subordinate object of this invention to provide a semiconductor device which is of the type described and which additionally comprises a transfer transistor along a semiconductor substrate with word and bit lines of a memory element disposed between the capacitor and the transistor.

It is a further principal object of this invention to provide a method of manufacturing a semiconductor device of the type described heretobefore in connection with principal objects of this invention.

Other objects of this invention will become clear as the description proceeds.

Incidentally, a spacer film or layer is etched away in a method according to this invention preferably in a manner disclosed in Japanese Patent Prepublication (A) No. 181,188 of 1994.

In accordance with an aspect of this invention, there is provided a semiconductor device comprising a capacitor which comprises a first capacitor electrode and a second capacitor electrode with a capacitor dielectric film interposed, wherein the first capacitor electrode comprises (A) a conductor pole having a pole end defining a predetermined length, a pole axis, and a peripheral surface and (B) a tray-shaped tray conductor layer which has a tray axis, is held by the conductor pole at a predetermined position of the peripheral surface with the tray axis parallel to the pole axis, and comprises (Ba) a plate portion extended perpendicular to the pole axis from the peripheral axis and having a plate periphery and (Bb) a peripheral portion extended parallel to the pole axis from the plate periphery towards the pole end.

In accordance with a different aspect of this invention, there is provided a method of manufacturing a semiconductor device comprising a capacitor which comprises a first capacitor electrode and a second capacitor electrode with a capacitor dielectric film interposed, comprising the steps of (A) forming a stack of a spacer film and a conductor layer on an insulator layer covering a principal surface of a semiconductor substrate, (B) forming a spacer layer as the conductor layer, (C) forming through the spacer layer, the conductor layer, the spacer film, and the insulator layer a conductor pole having a pole end and a peripheral surface, (D) selectively etching the spacer layer to leave on the-conductor layer a spacer block having a block surface parallel to the pole axis, (E) forming a conductor block in contact with the block surface and the conductor layer, (F) selectively etching the conductor block and the conductor layer to leave a plate portion and a peripheral portion, and (G) selectively etching away the spacer block and the spacer film to leave the conductor pole, the plate portion, and the peripheral portion collectively as the first capacitor electrode.

In accordance with another different aspect of this invention, there is provided a method of manufacturing a semiconductor device comprising a capacitor which comprises a first capacitor electrode and a second capacitor electrode with a capacitor dielectric film interposed, comprising the steps of (A) forming successive stacks of films and layers as at least a first stack of a first spacer film and a first conductor layer and a second stack of a second spacer film and a second conductor layer on an insulator layer covering a principal surface of a semiconductor substrate, (B) forming a spacer layer on the second conductor layer, (C) forming through the spacer layer, the second conductor layer, the second spacer film, the first conductor layer, the first spacer film, and the insulator layer a conductor pole having a pole end and a peripheral surface, (D) selectively etching the spacer layer to leave on the second conductor layer a first spacer block having a first spacer block surface parallel to the pole axis, (E) forming a first conductor block in contact with the first spacer block surface and the second conductor layer, (F) selectively etching the first conductor block and the second conductor layer to leave on the second spacer film a primary plate portion and a primary peripheral portion having a primary periphery parallel to the pole axis, (G) forming an additional spacer layer in contact with the primary periphery and the second spacer film, (H) selectively etching the additional spacer layer and the second spacer film to leave on the first conductor layer a second spacer block having a second spacer block surface parallel to the pole axis, (I) forming a second conductor block in contact with the second spacer block surface and the first conductor layer, (J) selectively etching the second conductor block and the first conductor layer to leave on the first spacer film a secondary plate portion wider than the primary plate portion and a secondary peripheral portion having a peripheral surface parallel to the pole axis, and (K) selectively etching away the first and the second spacer blocks and the first spacer film to leave the conductor pole, the primary and the secondary plate portions, and the primary and the secondary peripheral portions collectively as the first capacitor electrode.

DESCRIPTION OF THE PREFERRED EMBODIMENTS

Figure 1:
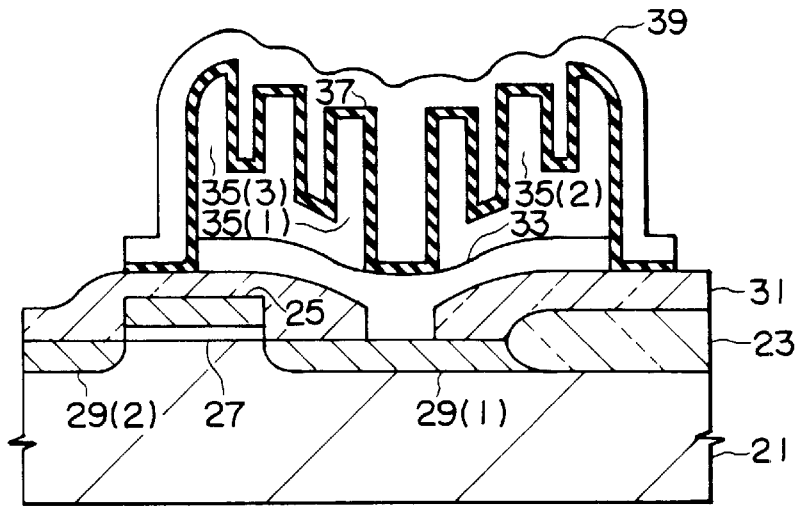
FIG. 1 is a schematic axial vertical sectional view of a conventional DRAM memory cell.

Referring to FIG. 1, a conventional DRAM memory cell will first be described in order to facilitate an understanding of the present invention. This DRAM memory cell is disclosed in Japanese Patent Prepublication (A) No. 264,767 of 1992 referred to hereinabove.

On a principal surface of a p-type semiconductor substrate 21 a field oxide layer 23 is formed at a predetermined location to isolate a cell or element region from adjacent cell regions. A transfer transistor of the DRAM memory cell is manufactured along the principal surface of the cell region. The transistor comprises a gate electrode 25 formed on a gate oxide film 27 grown on the principal surface. On both sides of the gate electrode 25, $n^+$ regions 29 are diffused into the principal surface at the cell region to provide a source (29(1)) and a drain (29(2)) electrode of the transistor. The source electrode 29(1) serves as a storage node of the DRAM memory cell.

Isolated from the transfer transistor by an insulator layer 31 formed on the field oxide layer 23, the gate electrode 25, and the source and the drain electrodes 29 (suffixes (1) and (2) omitted) with a contact hole formed on the source electrode 29(1), a capacitor of the DRAM memory cell is stacked on the transistor.

The capacitor includes a first or lower capacitor electrode which comprises a lower electrode layer 33 formed on the insulator layer 31 and is brought into contact with the source electrode 29(1) through the contact hole. In the first capacitor electrode, a plurality of concentric circular cylindrical conductor layers 35 are formed perpendicular to the principal surface in direct contact with the lower electrode layer 33. In FIG. 1, the concentric circular cylindrical conductor layers 35 consist of first to third conductor layers 35(1), 35(2), and 35(3) as counted from center to periphery and depicted with an interface by a line although the conductor layers 35 are integral with the lower electrode layer 33.

With a capacitor dielectric film 37 interposed, a second or upper capacitor electrode 39 is formed. In this manner, the DRAM memory cell comprises the transistor (25, 29) and the capacitor (33–39) stacked on the transistor.

Figure 2:
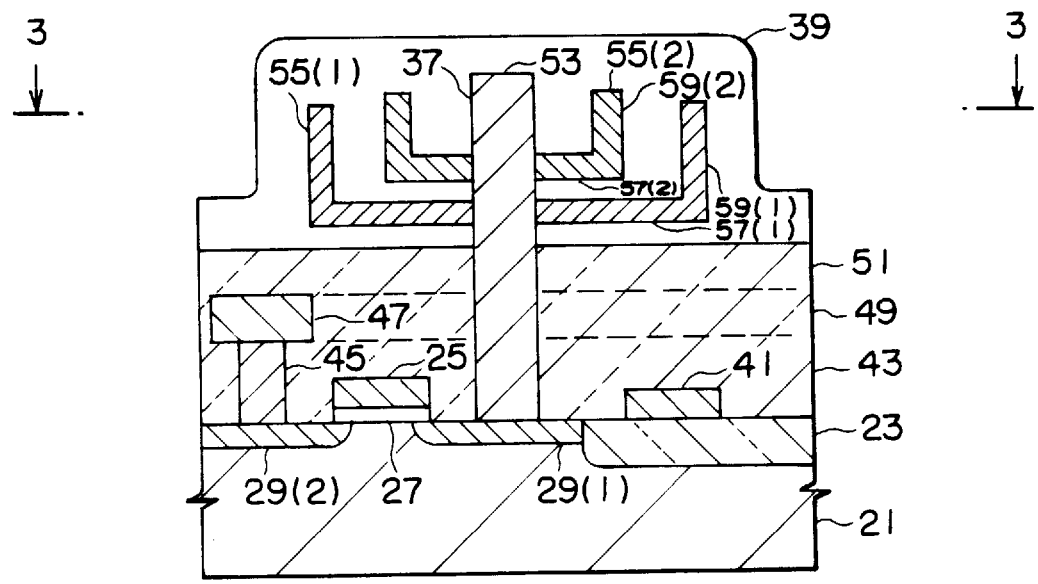
FIG. 2 schematically shows an axial vertical section of a semiconductor device according to a first embodiment of the instant invention.
Figure 3:
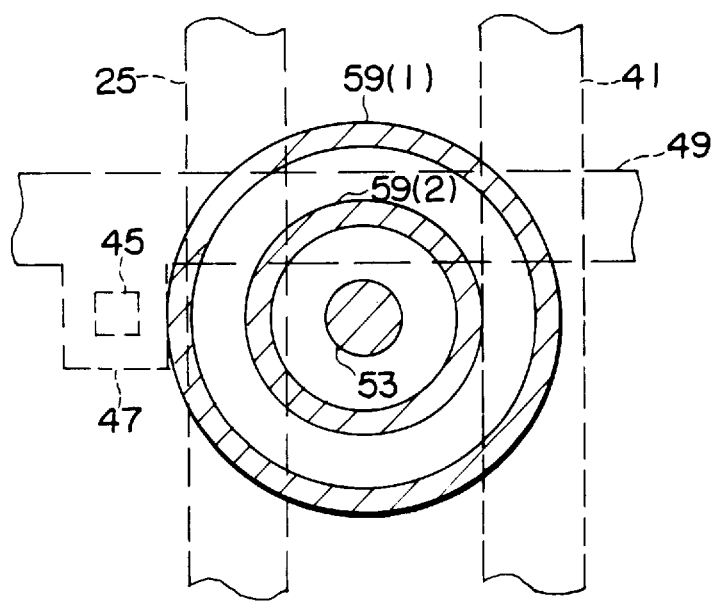
FIG. 3 schematically shows a horizontal section on line 3—3 of FIG. 2.

Referring now to FIGS. 2 and 3, the description will proceed to a semiconductor device according to a first preferred embodiment of this invention. The semiconductor device is for use as a DRAM memory cell. Preferred materials and dimensions will presently be described. Throughout the following similar parts are designated by like reference numerals.

Like in FIG. 1, the semiconductor device comprises a MOS transistor as the transfer transistor (25, 29) formed along the principal surface of the semiconductor substrate 21 in which the cell region is isolated by the field oxide layer 23. Stacked on the transistor, the capacitor has a capacitor axis which will shortly become clear. Together with the gate oxide film 27, the gate electrode 25 is extended perpendicular to the plane of FIG. 2 in an offset relation to the capacitor axis. The source electrode 29(1) is on the capacitor axis and is alternatively referred to herein as a capacitor diffused region. Relative to the gate electrode 25, the drain electrode 29(2) is on an opposite side of the source electrode 29(1) and is herein called a bit-line diffused region.

For the memory cell, a word line 41 is formed parallel to the gate electrode 25 on the field oxide layer 23 and is connected to a gate electrode of an adjacent transfer transistor which is not shown.

As a part of the insulator layer 31 described in conjunction with FIG. 1, a first insulator layer 43 is laid on the isolation oxide layer 23, the gate electrode 25, the source and the drain electrodes 29, and the word line 41. Reaching the drain electrode 29(2), a bit-line contact hole is formed through the first insulator layer 43 and is filled with a bit-line contact plug 45. Connected to the bit-line contact plug 45 by a bit-line pad 47, a bit line 49 is formed on the first insulator layer 43 as by tungsten or a like conductor material in an offset relation to the capacitor axis. As a remaining part of the insulator layer 31, a second insulator layer 51 is formed on the bit line 49 and the first insulator layer 43.

Reaching the source electrode 29(1), a capacitor contact hole is formed on the capacitor axis through the second and the first insulator layers 31 (or 43 and 51) and is filled with a conductor pole 53 which has a pole axis coincident with the capacitor axis, a pole end defining a predetermined length to the source electrode 29(1), and a peripheral surface. Having the predetermined length, the conductor pole 53 extends above an upper exposed surface of the second insulator layer 51. In the example being illustrated, the peripheral surface is circular cylindrical.

Held by the conductor pole 53 at a first predetermined position of the peripheral surface on a first level, a first tray-shaped tray conductor layer 55(1) has a first tray axis parallel to the pole axis. In FIGS. 2 and 3, the tray conductor layer 55(1) is cup shaped. The peripheral surface is circular cylindrical. In any event, the tray conductor layer 55(1) comprises a first plate portion 57(1) extended perpendicular to the pole axis from the peripheral surface and having a first plate periphery. The tray conductor layer 55(1) further comprises a first peripheral portion 59(1) extended parallel to the pole axis from the first plate periphery to a level near the pole end and having a peripheral surface directed away from the pole axis. Having a shape similar to the first tray-shaped tray conductor layer 55(1), a second tray-shaped tray conductor layer 55(2) is held by the conductor pole 53 at a second predetermined position of the peripheral surface on a second level nearer to the pole end than the first level with a second tray axis parallel to the pole axis. This tray conductor layer 55(2) comprises a second plate portion 57(2) extended from the peripheral surface perpendicular to the pole axis nearer to the pole end than the first plate portion 57(1) and having a second plate periphery nearer to the pole axis than the first plate periphery. The tray conductor layer 55(2) further comprises and a second peripheral portion 59(2) extended parallel to the pole axis from the second plate periphery nearer to the pole end than the first peripheral portion 59(1).

An entirety or combination of the conductive pole 53 and the first and the second tray-shaped tray conductor layers 55 (suffixes (1) and (2) omitted) serves as a first capacitor electrode (53, 55) of the capacitor. As seen in FIG. 2, the capacitor dielectric film 37 is formed on an entire exposed surface of the first capacitor electrode above the second insulator layer 51 and indicated by a thick solid line. The second capacitor electrode 39 is formed on the capacitor dielectric film 37 and may be brought into contact with the second insulator layer 51. The second capacitor electrode 39 is connected to a capacitor terminal (not shown) supplied with constant voltage power in the manner known in the art of DRAM memories.

Turning to FIGS. 4(A) to 4(F), a preferred semiconductor device manufacturing method will be described for use in manufacturing the first capacitor electrode of the semiconductor device illustrated with reference to FIGS. 2 and 3. It will be surmised that the DRAM memory cell is for a 1-Gb DRAM.

Figure 4A:
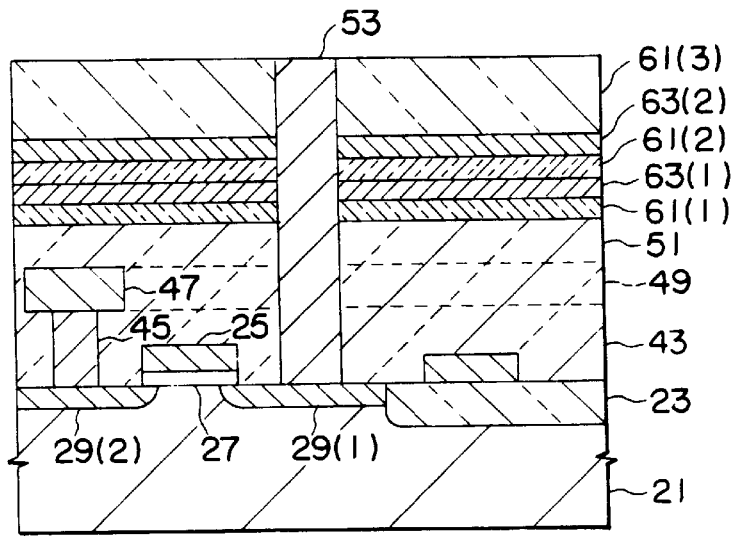
FIGS. 4(A) to 4(F) schematically show axial vertical sections of the semiconductor device illustrated in FIG. 2 at various steps of manufacture.

In FIG. 4(A), a p-type silicon substrate was used as the semiconductor substrate 21. The field oxide layer 23 was formed in a predetermined pattern on the principal surface of the semiconductor substrate 21. In the manner known in the art, the field oxide layer 23 is formed either by trench element isolation or according to a recess LOCOS method.

Also in FIG. 4(A), the MOS transistor was manufactured along the principal surface of the semiconductor substrate 21 in the element region for use as a transfer transistor (25, 29) of the DRAM memory cell. More particularly, the gate electrode 25 was formed of titanium silicide to a film thickness of about 100 nm on the gate oxide film 27 of a silicon dioxide film of a thickness of about 6 nm. The source and the drain electrodes 29(1) and 29(2) were diffused into the semiconductor substrate 21 to a diffusion depth of about 0.1 micron to have an $n^+$ conductivity type. Together with the gate electrode 25, the word line 41 was formed on the field oxide layer 23.

Subsequently, the first insulator layer 43 was formed on the field oxide layer 23, the gate electrode 25, the source and the drain electrodes 29, and the word line 41 by CVD (chemical vapor deposition) of silicon dioxide. The first insulator layer 43 was subjected to CMP (chemical mechanical polish) to have a flat surface and a first layer thickness of about 500 nm.

The bit-line contact hole was now formed through the first insulator layer 43 to reach the drain electrode 29(2). In the bit-line contact hole, the bit-line contact plug 45 was filled with a conductor material which may be tungsten, titanium nitride, or tungsten silicide. On the flat surface of the first insulator layer 43 and in contact with the bit-line contact plug 45, a tungsten layer was CVD deposited to a thickness of 300 nm. This tungsten layer was machined by the photolithography method and the dry etching into the bit-line pad 47 and the bit line 49.

Like the first insulator layer 43, the second insulator layer 51 was formed to cover the flat surface of the first insulator layer 43, the bit-line pad 47, and the bit line 49 to a thickness of about 400 nm. The first and the second insulator layers 43 and 51 collectively serve with the bit and the word lines 41 and 49 embedded as the insulator layer 31 described in connection with FIG. 1.

Covering the second insulator layer 51, a first spacer film 61(1) was formed by atmospheric CVD to a spacer film thickness of about 50 nm. Preferably, the first spacer film 61(1) is made of PSG (phospho-silicate glass) doped with phosphor of about 5 mol-percent. Covering the first spacer film 61(1), a first conductor layer 63(1) was formed by CVD of polycrystalline silicon including phosphor of an impurity concentration of from $1\times10^{19}$ to $1\times10^{20}$ atoms/cm$^3$ to a conductor layer thickness of about 30 nm. In the manner described in connection with the first spacer film 61(1) and the first conductor layer 63(1), a second spacer film 61(2) and a second conductor layer 63(2) were successively formed on the first conductor layer 63(2). On the second conductor layer 63(2), a spacer layer 61(3) was formed like the first and the second spacer films 61 (suffixes (1) and (2) omitted) to a spacer layer thickness of about 100 nm.

Finally in FIG. 4(A), the capacitor contact hole was formed along the capacitor axis through the spacer layer 61(3), the second conductor layer 63(2), the second spacer film 61(2), the first conductor layer 63(1), the first spacer film 61(1), and the insulator layer 31 or 43 and 51 to reach the source electrode 29(1). The capacitor contact hole has a diameter of about 0.1 micron and was filled with polycrystalline silicon with a phosphor dopant of about $1\times10^{19}$ atoms/cm$^3$ to provide the conductor pole 53.

Figure 4B:
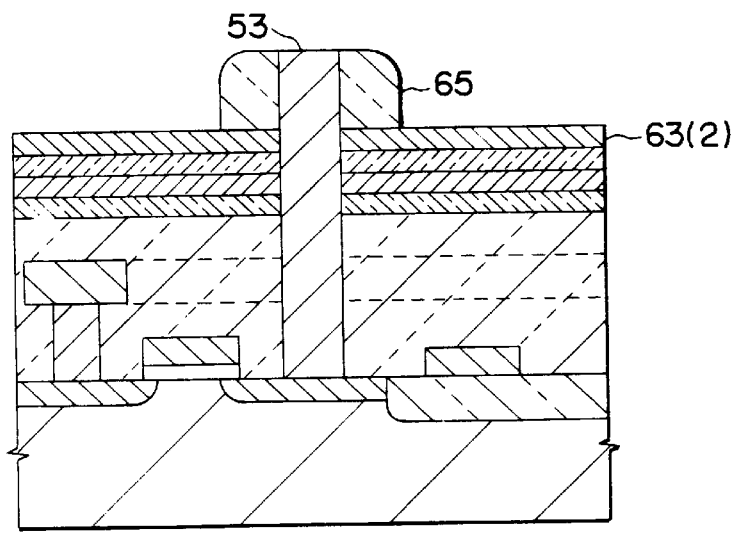

In FIG. 4(B), the spacer layer 61(3) of FIG. 4(A) was selectively anisotropically dry etched by RIE (reactive ion etching) to leave on the second conductor layer 63(2) and in contact with the peripheral surface of the conductor pole 53 a first spacer block 65 having a spacer block wall thickness of about 50 nm and a first spacer block surface parallel to the pole axis. In the RIE, a mixture of $CH_2F_2$ and $CF_4$ was used as a first reaction gas.

Figure 4C:
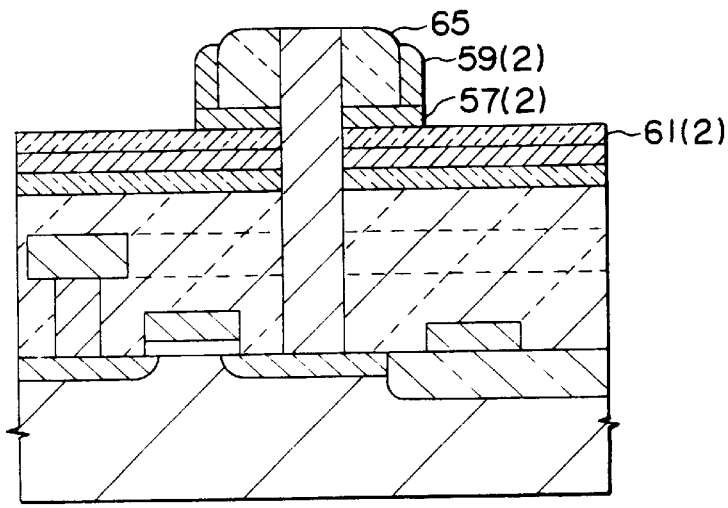

In FIG. 4(C), a first conductor block of polycrystalline silicon with the phosphor dopant was deposited in contact with the first spacer block surface and in integral contact with the second conductor layer 63(2) to a first conductor block thickness of about 40 nm above the second conductor layer 63(2). The RIE was with a second reaction gas of $Cl_2$, $O_2$, and HBr and applied to selectively anisotropically etch the second conductor layer 63(2) and the first conductor block and to leave a plate portion and a peripheral portion on the second spacer film 61(2) for use as the second plate portion 57(2) and the second peripheral portion 59(2) having a wall thickness of about 30 nm. It should be noted that the first conductor block is not wholly depicted in FIG. 4(C) but only partly as the second peripheral portion 59(2).

Figure 4D:
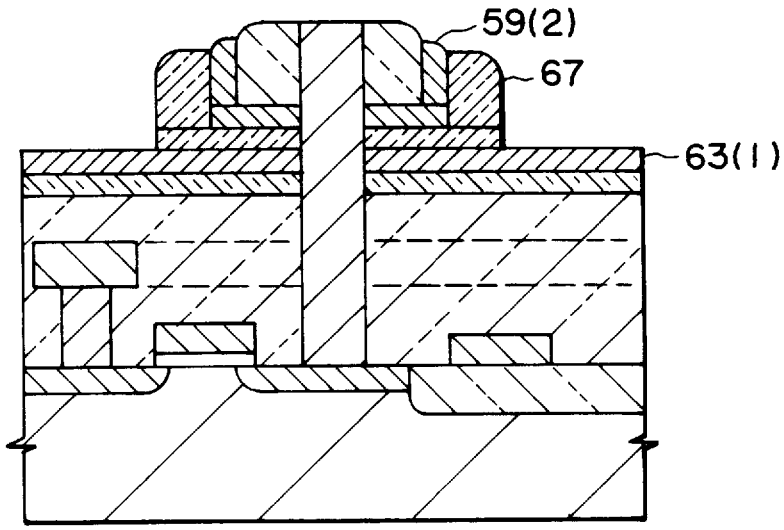

In FIG. 4(D), an additional spacer layer of the PSG with the 5-mol-percent phosphor dopant was deposited on the second spacer layer 61(2) in contact with the second peripheral portion 59(2) to the spacer layer thickness. Anisotropic selective dry etching was applied to the second spacer film 61(2) and the additional spacer layer by the RIE with the first reaction gas to leave a second spacer block 67 around the second peripheral portion 59(2) on the first conductor layer 63(1) to have a second block surface with the spacer block wall thickness.

Figure 4E:
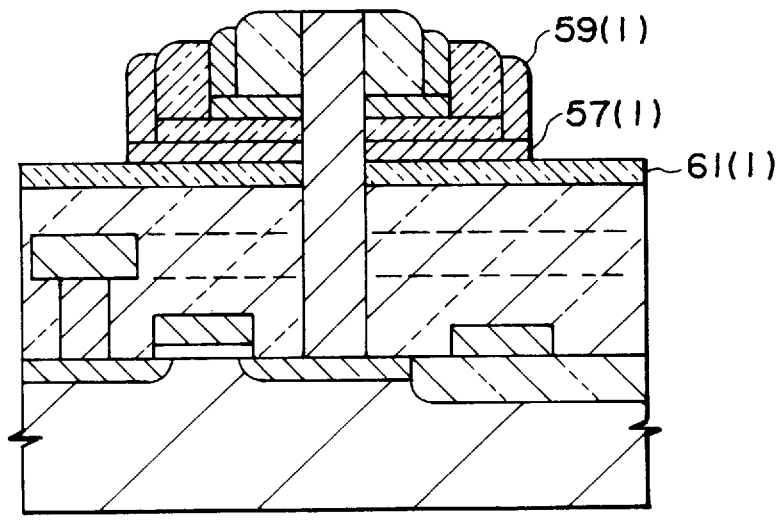

In FIG. 4(E), a second conductor block of polycrystalline silicon with the phosphor dopant was deposited to a thickness of about 50 nm in contact with the second block surface and in integral contact with the first conductor layer 63(1). The RIE with the second reaction gas was applied to selectively anisotropically dry etch the first conductor layer 63(1) and the second conductor block and to leave the first plate portion 57(1) and the first peripheral portion 59(1) on the first spacer film 61(1). The first peripheral portion 59(1) was given the about 30-nm wall thickness.

Figure 4F:
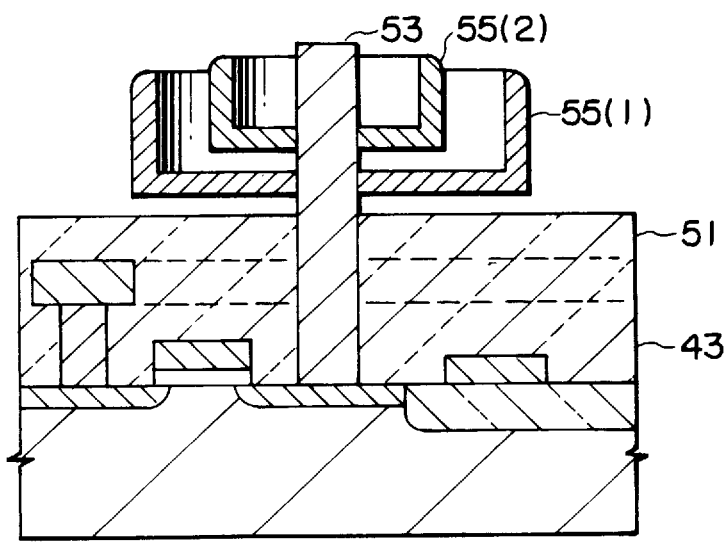

In FIG. 4(F), selective etching was applied primarily to the first and the second spacer blocks 65 and 67 (including remaining portions of the spacer layer 61(3) and the second spacer film 61(2)) and the first spacer film 61(1) to form the first capacitor electrode (53, 55). This selective etching is preferably a hydrogen fluoride vapor phase selective etching method described in Japanese Patent Prepublication (A) No. 181,188 of 1994 referred to hereinabove. More specifically, an etching chamber is used, into which a mixture of hydrogen fluoride gas of 600 Pa and water vapor of less than 1 Pa was introduced at room temperature. In this etching mixture, the PSG with the phosphor dopant is etched at an etching rate of 1,000 nm/min. The polycrystalline silicon with the phosphor dopant is etched at a slow etching rate of only 1.5 nm/min. During an etching duration of removing the spacer film and blocks, the first and the second plate portions 57 and the first and the second peripheral portions 59 were etched only to an etch depth of about 0.5 nm.

In FIGS. 2 through 4(A) to 4(F), the first capacitor electrode (53, 55) has a total diameter of about 0.4 micron and a height between 0.4 and 0.3 micron above the second insulator layer 51. A silicon nitride film was deposited on the exposed surface of the first capacitor electrode and was oxidized to form the capacitor dielectric film 37 of a dielectric film thickness of about 5 nm. Subsequently, the second capacitor electrode 39 was formed by deposition of polycrystalline silicon doped with phosphor.

It is now understood that the capacitor is given a sufficient mechanical strength by the conductor pole 53 and a sufficient capacitance. Above the insulator layer 31, the capacitor is highest at the capacitor axis and becomes lower towards its periphery.

Figure 5:
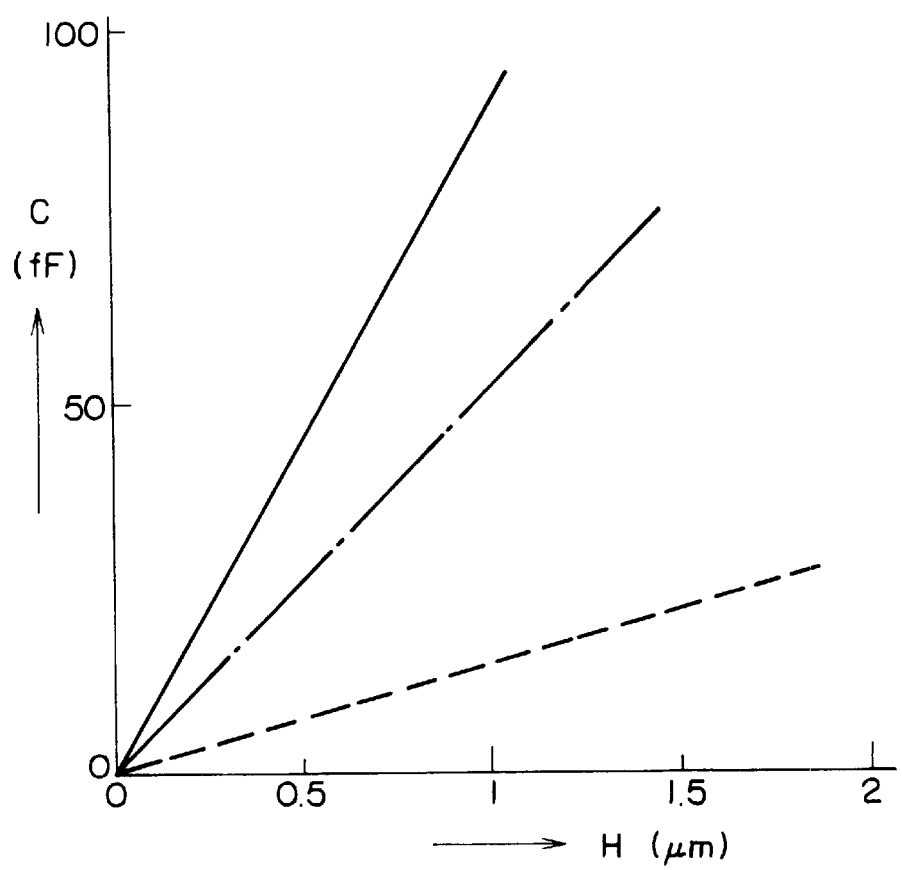
FIG. 5 schematically shows capacitance characteristics for use in describing technical merits achieved by this invention.

Further turning to FIG. 5, technical merits were attained by this invention as follows. Capacitors were manufactured in various manners to have a capacitor area of 0.4 micron square and for use in a DRAM memory cell of 1-Gb DRAM's. Each capacitor comprised a capacitor dielectric film of a dielectric film thickness of 4 nm when measured as a silicon dioxide film. With various heights H of the first capacitor electrode, such as 33 and 35 of FIG. 1 or 53 and 55 of FIGS. 2 through 4(A) to 4(F), a capacitance C was measured.

As regards capacitors in which the first capacitor electrode had a cubic form, measured values are illustrated by a dashed line. In connection with capacitors of the structure of FIG. 1 with triple concentric circular cylindrical conductor layers of a layer thickness of 30 nm, measured values are depicted by a dash-dot line. For capacitors manufactured in the manner illustrated with reference to FIGS. 4(A) to 4(F), measured values are depicted by a solid line.

When the first capacitor electrode has a height of 0.5 micron, the capacitance is 45 fF according to FIGS. 4(A) to 4(F) and is greater by a factor of about 1.5 to 1.8 than the capacitance of 25 to 30 fF achieved by the structure of FIG. 1. For capacitors having a predetermined capacitance, it is possible to reduce the height in accordance with FIGS. 4(A) to 4(F) to about one half of the height necessary according to the structure of FIG. 1. Usually, each memory cell is given a capacitance of 30 fP. According to FIGS. 4(A) to 4(F), the height is about 0.3 micron in contrast to the height of 0.5 to 0.6 micron necessary according to FIG. 1. Incidentally, the height becomes as high as about 2 microns when the first capacitor electrode has the cubic form.

Figure 6:
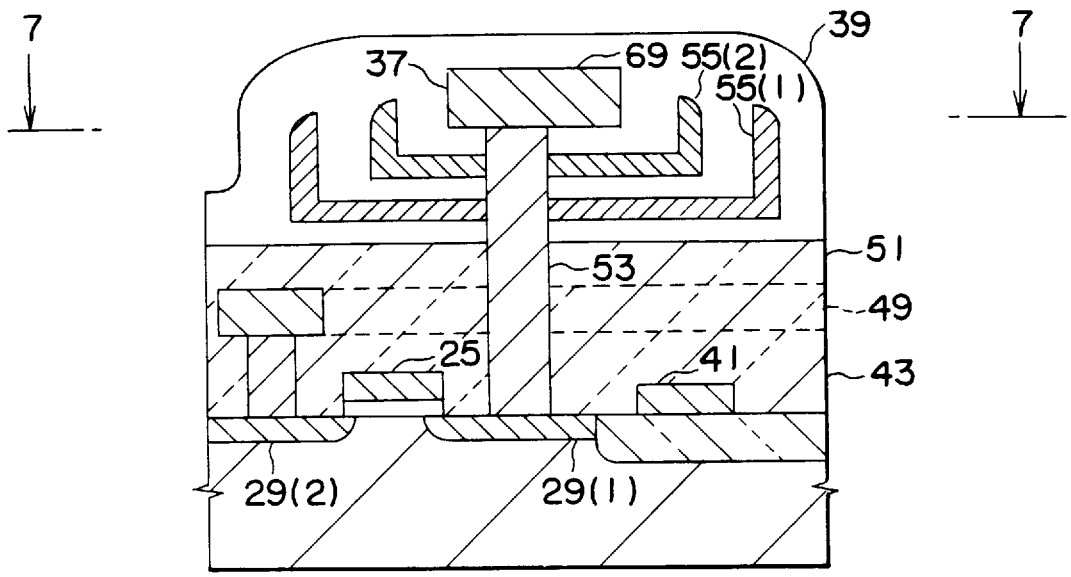
FIG. 6 is a schematic axial vertical sectional view of a semiconductor device according to a second embodiment of this invention.
Figure 7:
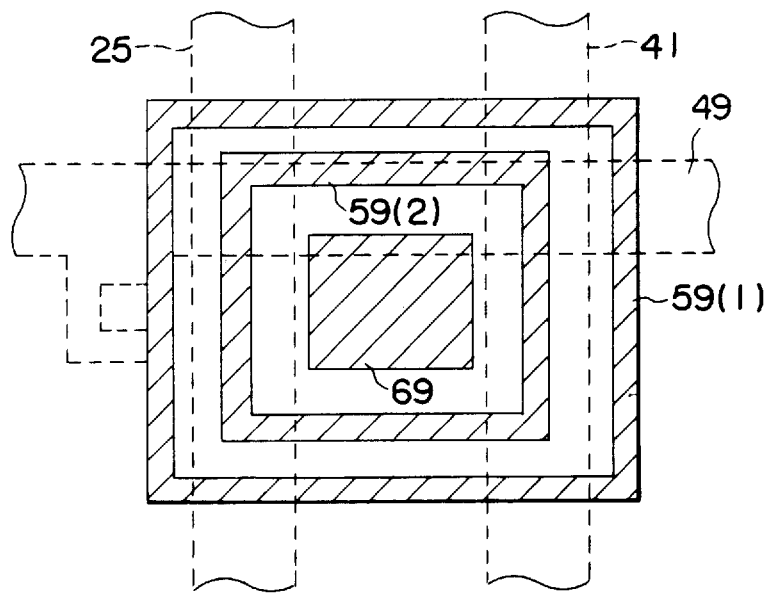
FIG. 7 is a schematic horizontal sectional view of the semiconductor device on line 7—7 of FIG. 6.

Referring to FIGS. 6 and 7, a semiconductor device has a similar structure according to a second preferred embodiment of this invention. The first capacitor electrode further comprises a planar conductor layer 69 on and in contact with the pole end of the conductor pole 53. In addition, the first and the second tray-shaped tray conductor layers 55(1) and 55(2) are rectangular in plan.

More in particular, the first tray-shaped tray conductor layer 55(1) has a first tray axis parallel to the pole axis. The second tray-shaped tray conductor layer 55(2) has a second tray axis parallel to the pole axis. In the manner understood from FIG. 6, it is unnecessary that the first tray axis be coincident with the pole axis and that the second tray axis be coincident either with the pole axis or with the first tray axis. It is, however, very desirable that the first plate and peripheral portions 57(1) and 59(1) have long and short sides parallel to long and short sides of the second plate and peripheral portions 57(2) and 59(2). The planar conductor layer 69 is rectangular in plan and has longer and shorter sides parallel to and shorter than the long and the short sides of the second plate and peripheral portions 57(2) and 59(2). The conductor pole 53 has a cross section which may be e.r. either a circle and a rectangle. It is assumed here that the conductor pole 53 has a circular cylindrical shape.

Turning to FIGS. 8(A) to 8(F), another preferred semiconductor device manufacturing method will be described as regards the first capacitor electrode of the semiconductor device illustrated with reference to FIGS. 6 and 7. It should be noted in connection with this method that different insulator materials were used in forming the first and the second spacer films 61(1) and 61(2), the spacer layer 61(3), and the additional spacer layer. Consequently, the first reaction gas for the RIE may or may not be different from that described above. In other respects, this method is not different from that described with reference to FIGS. 4(A) to 4(F) unless otherwise positively mentioned.

Figure 8A:
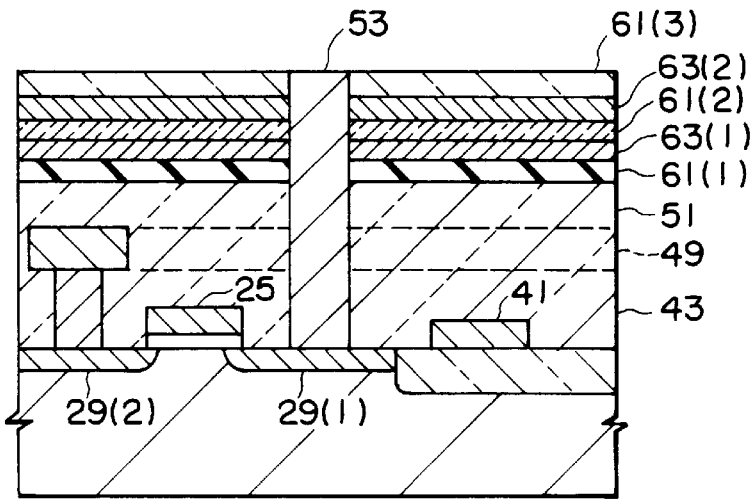
FIGS. 8(A) to 8(F) are schematic axial vertical sectional views of the semiconductor device depicted in FIG. 6 at various steps of manufacture.

In FIG. 8(A), the MOS transistor (25, 29) was manufactured along the principal surface of the semiconductor substrate 21. The first and the second insulator layers 43 and 51 were formed on the transistor and the field oxide layer 23 with the word and the bit lines 41 and 49 embedded in the first and the second insulator layers 43 and 51.

For use as the first spacer film 61(1), a mask film was deposited on the second insulator layer 51 by CVD of silicon nitride under one atmosphere to a mask thickness of 50 nm, namely, to the spacer film thickness. For use as the second spacer film 61(2), a silicon dioxide film was deposited on the first conductor layer 63(1) to the spacer film thickness. For use as the spacer layer 61(3), a silicon dioxide layer was deposited on the second conductor layer 63(2) to a spacer layer thickness which was now equal to the spacer film thickness. The conductor pole 53 was filled in the capacitor contact hole of the diameter of about 0.1 micron.

Figure 8B:
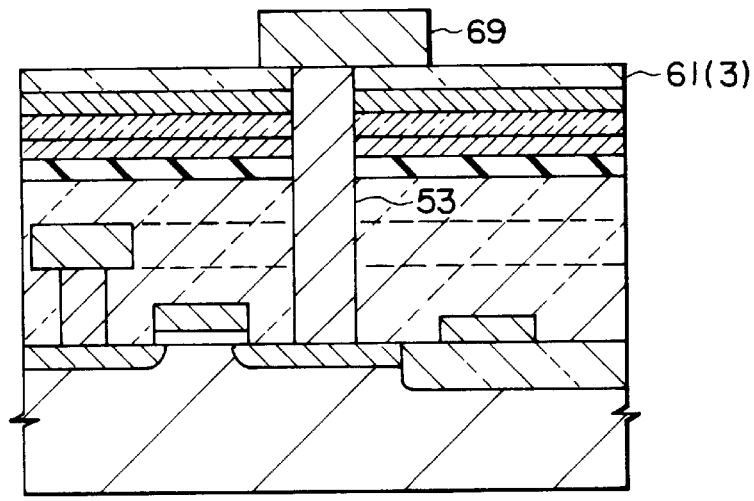

In FIG. 8(B), the polycrystalline silicon with the phosphor dopant was formed as an overlying layer of a conductor material on the spacer layer 61(3) and in integral contact with the conductor pole 53 at the pole end to a conductor layer thickness of about 100 nm. The overlying layer was patterned in the known manner into the planar conductor layer 69 of a rectangular shape of 0.15 micron×0.25 micron.

Figure 8C:
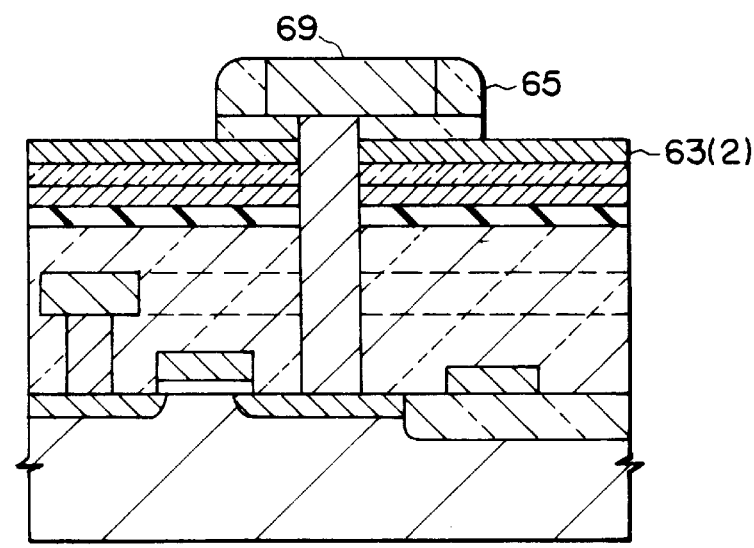

In FIG. 8(C), the first spacer block 65 was formed to have the first spacer block surface and the spacer block thickness. Although designated by the reference numeral 65, the spacer block 65 is only partly in contact with the peripheral surface of the conductor pole 53 and in contact with a peripheral surface of the planar conductor layer 69. During the RIE of manufacturing the first spacer block 65, the first reaction gas was the above-mentioned mixture of $CH_2F_2$ and $CF_4$. Alternatively, the first reaction gas was a different mixture of $CHF_3$ and CO.

Figure 8D:
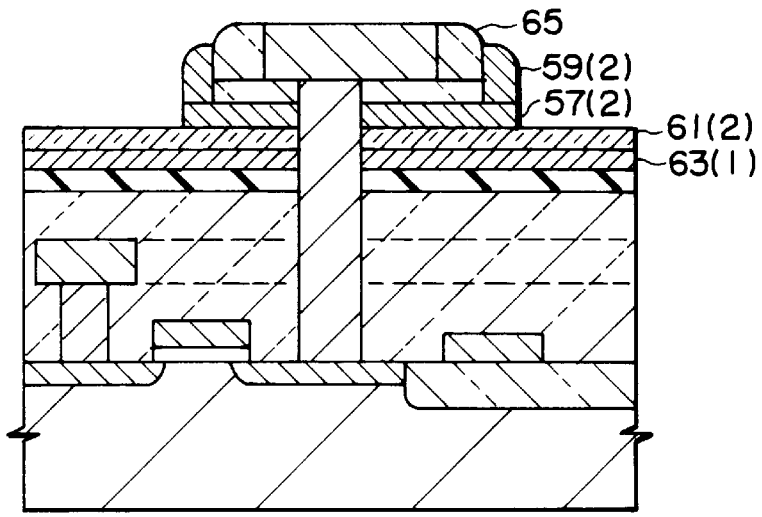

In FIG. 8(D), the first conductor block was formed in contact with the first spacer block surface and integrally on the second conductor layer 63(2) to the conductor layer thickness of 30 nm. The first conductor block and the second conductor layer 63(2) were etched to provide the second plate portion 57(2) and the second peripheral portion 59(2) which was given a thinner conductor wall thickness of 20 nm.

Figure 8E:
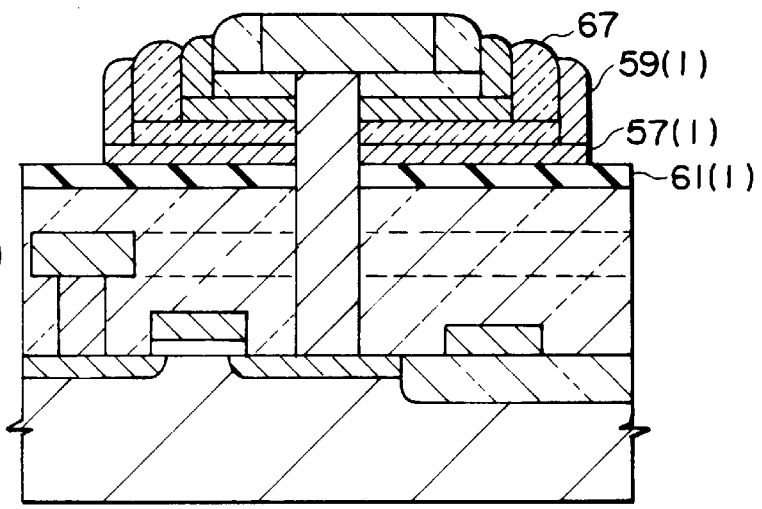

In FIG. 8(E), the second spacer block 67 was formed by the RIE of the second spacer film 61(2) and an additional spacer layer deposited integrally on the second spacer film 61(2) to the thickness of about 50 nm. The additional spacer layer was made of silicon dioxide. The first reaction gas for the RIE was therefore either the afore-mentioned mixture or the different mixture. Subsequently, the second conductor block was formed in contact with the first spacer block surface and integrally on the first conductor layer 63(1) to the block thickness of about 30 nm. The second conductor block and the first conductor layer 63(1) were etched into the first plate portion 57(1) and the first peripheral portion 59(1) of the wall thickness of 20 nm.

Figure 8F:
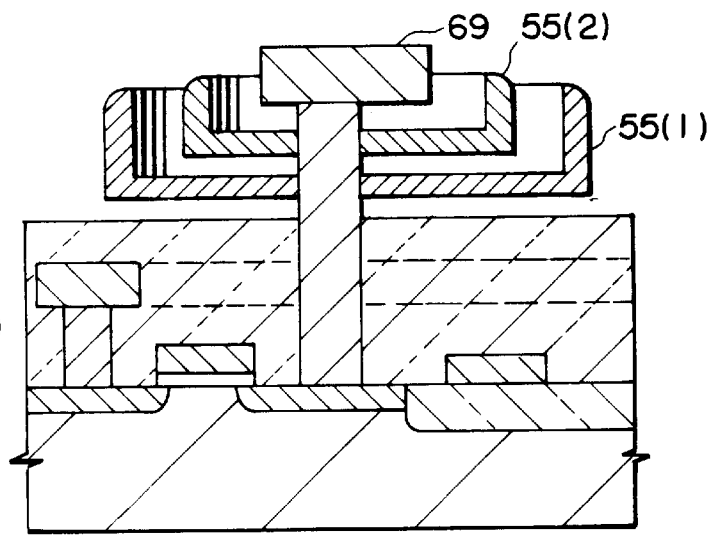

In FIG. 8(F), the first and the second spacer blocks 65 and 67 were etched away, remaining portions of the spacer layer 61(3) and the second spacer film 61(2) inclusive, by wet etching in hydrogen fluoride aqueous solution. In the meantime, the first spacer film 61(1) protects the second insulator layer 51. The first spacer film 61(1) was thereafter etched away in phosphoric acid.

Reviewing FIGS. 8(A) to 8(F), the first capacitor electrode (53, 55, 69) occupied a capacitor area of 0.35 micron× 0.45 micron in the semiconductor device and was about 0.3 micron high. It is now understood possible to manufacture for etch away the first and the second spacer films 61(1) and 61(2), the spacer layer 61(3), and the first and the second spacer blocks 65 and 67 in whichever of insulator materials exemplified in FIGS. 4(A) to 4(F) and FIGS. 8(A) to 8(F).

Turning back to FIG. 7, the capacitor dielectric film 37 was formed to cover exposed surfaces of the first capacitor electrode to a thickness of about 5 nm. Subsequently, the second capacitor electrode 39 was deposited.

Figure 9:
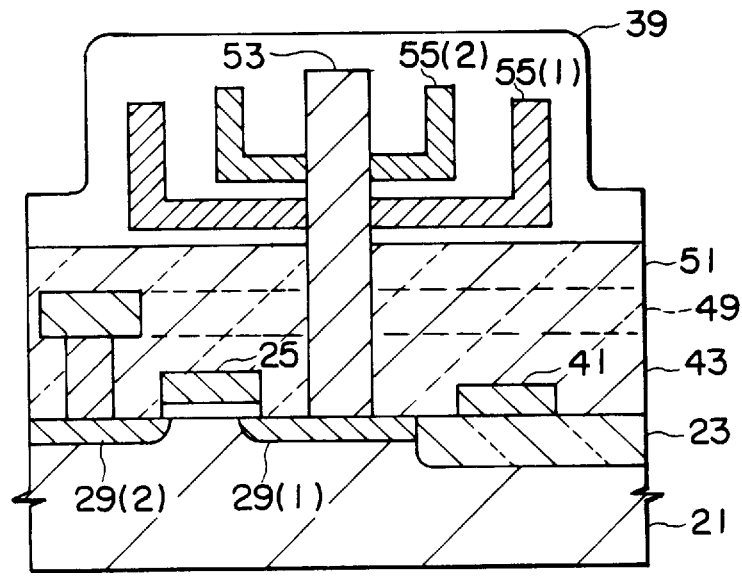
FIG. 9 is a schematic axial vertical sectional view of a modification of the semiconductor device illustrated in FIG. 2.

Referring to FIG. 9, the first tray-shaped tray conductor layer 55(1) has thicker plate and peripheral walls than the second tray-shaped tray conductor layer 55(2) in a modification of the semiconductor device illustrated with reference to FIGS. 2 and 3. For example, the first conductor layer was given a thickness of about 60 nm in FIG. 4(A). This gives a stronger mechanical strength to the first capacitor electrode (53, 55).

Figure 10:
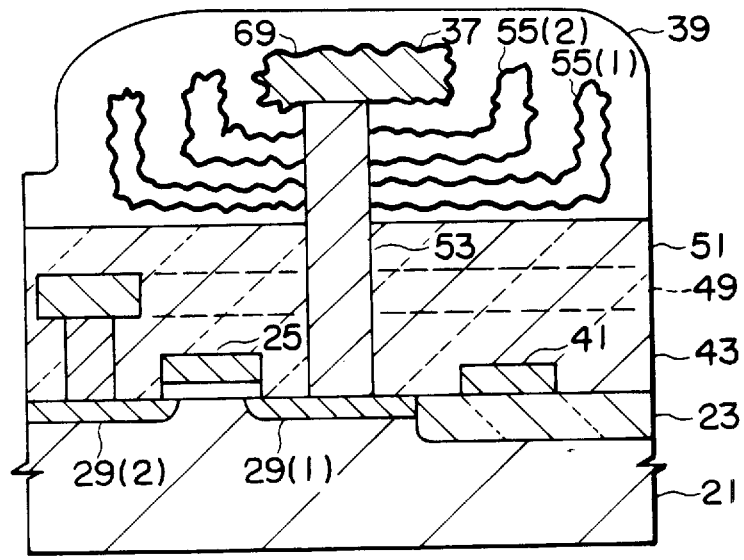
FIG. 10 is a schematic axial vertical sectional view of a modification of the semiconductor device depicted in FIG. 6.

Turning to FIG. 10, the first and the second tray-shaped tray conductor layers 55 and the planar conductor layer 69 are given corrugated exposed surfaces in a modification of the semiconductor device illustrated with reference to FIGS. 6 and 7. It should be noted that the capacitor dielectric film 37 and the second capacitor electrode 39 are successively formed on the corrugated exposed surface of the first capacitor electrode (53, 55, 69) and are given likewise corrugated surfaces. A greater capacitance is thereby given to the capacitor.

Again referring to FIG. 8(F), the first and the second tray-shaped tray conductors 55 and the planar conductor layer 69 were heat treated at a temperature between 600° and 700° C. in high vacuum of higher than $10^{-5}$ Torr with introduction of amorphous silicon including the phosphor dopant. This resulted in the corrugated surfaces of polycrystalline silicon of particle sizes of about 5 nm. This gave a corrugated exposed surface also to the conductor pole 53.

Figure 11:
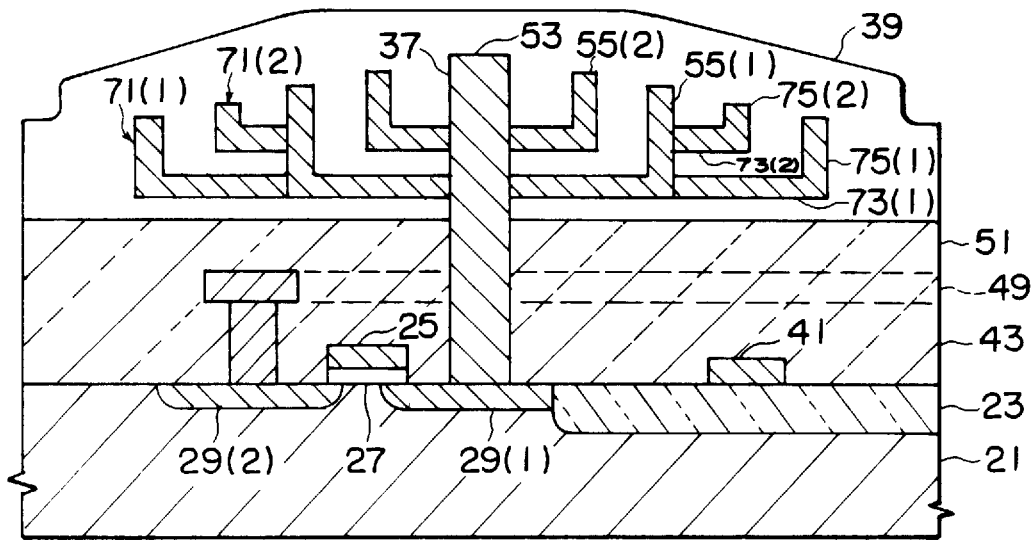
FIG. 11 is a schematic axial vertical sectional view of a semiconductor device according to a third embodiment of this invention.

Referring now to FIG. 11, attention will be directed to a semiconductor device according to a third preferred embodiment of this invention. In this semiconductor device, the first capacitor electrode (53, 55) additionally comprises a tray-shaped additional conductor layer 71 which has an additional axis and is held horizontally outwardly by the first peripheral portion 59(1) of the first tray-shaped tray conductor layer 55(1) with the additional axis parallel to the pole axis. The additional conductor layer 71 comprises a planar portion 73 extended coplanar with the first plate portion 57(1) from the peripheral surface of the first peripheral portion 59(1) and having a planar portion periphery and an additional portion 75 extended parallel to the pole axis from the planar portion periphery towards the pole end of the conductor pole 53 shorter than the first peripheral portion 59(1).

The tray conductor layers 55 may have any one of the structures described in conjunction with FIGS. 2 through 4(A) to 4(F), FIGS. 6 through 8(A) to 8(F), and FIGS. 9 and 10. The tray conductor layers 55 may consist of only the first tray-shaped tray conductor layer 55(1).

It will be assumed in the following merely for brevity of the description that the tray conductor layers 55 are of the type described in connection with FIGS. 2 through 4(A) to 4(F) and that the above-described additional conductor layer 71 is a first tray-shaped additional conductor layer 71(1) comprising the planar portion 73 and the additional portion 75 respectively as a first planar portion 73(1) and as a first additional portion 75(1). In this event, the planar portion periphery is called a first planar portion periphery. The additional axis is called a first additional axis and is coincident with the pole axis. With the first planar portion 73(1) disposed coplanar with the first plate portion 57(1) and with the first additional portion 75(1) extended from the first planar portion 73(1) towards the pole and, the first additional conductor layer 71(1) will be said to be extended from the first tray conductor layer 55(1) on a first level.

In the example illustrated, the semiconductor device further comprises a second tray-shaped additional conductor layer 71(2) having a second additional axis and is held by the first peripheral portion 59(1) at the peripheral surface with the second additional axis positioned parallel to the pole axis on a second level which is nearer to the pole end than the first level. The second tray-shaped additional conductor layer 71(2) comprises a second planar portion 73(2) extended from the peripheral surface and having a second planar portion periphery nearer to the pole axis, namely, to the peripheral surface, than the first planar portion periphery and a second additional portion 75(2) extended parallel to the pole axis from the second planar portion periphery nearer towards the pole end than the first additional portion 75(1) and farther than the first peripheral portion 59(1). Disposed on the second level, the second planar portion 73(2) may be coplanar with the second plate portion 57(2). The second planar portion 73(2) should, however, not be farther from the pole end in a direction of the pole axis than the second plate portion 57(2).

Figure 12A:
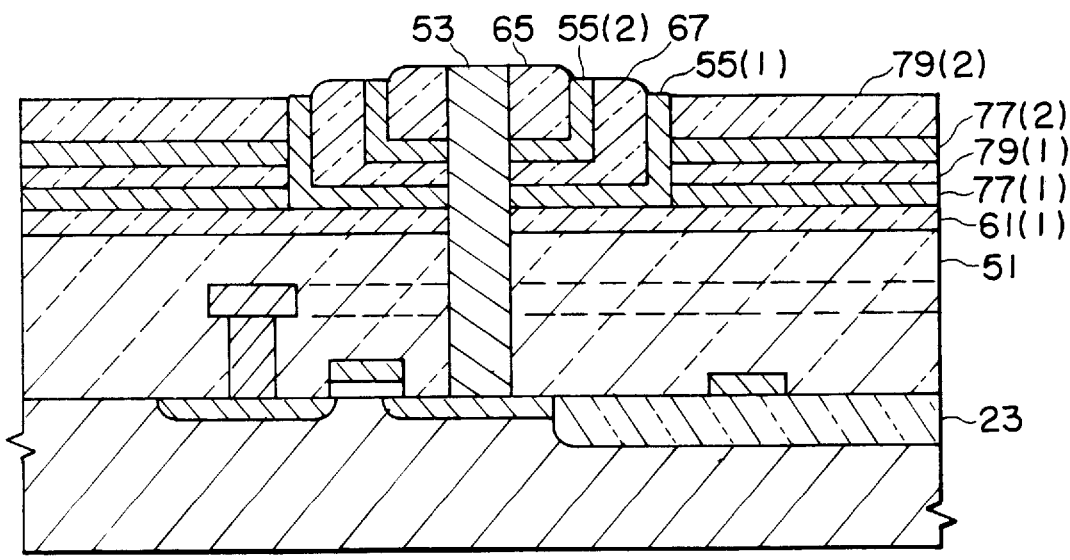
FIGS. 12(A) to 12(C) schematically show axial vertical sections of the semiconductor device illustrated in FIG. 11 at later steps of manufacture.
Figure 12B:
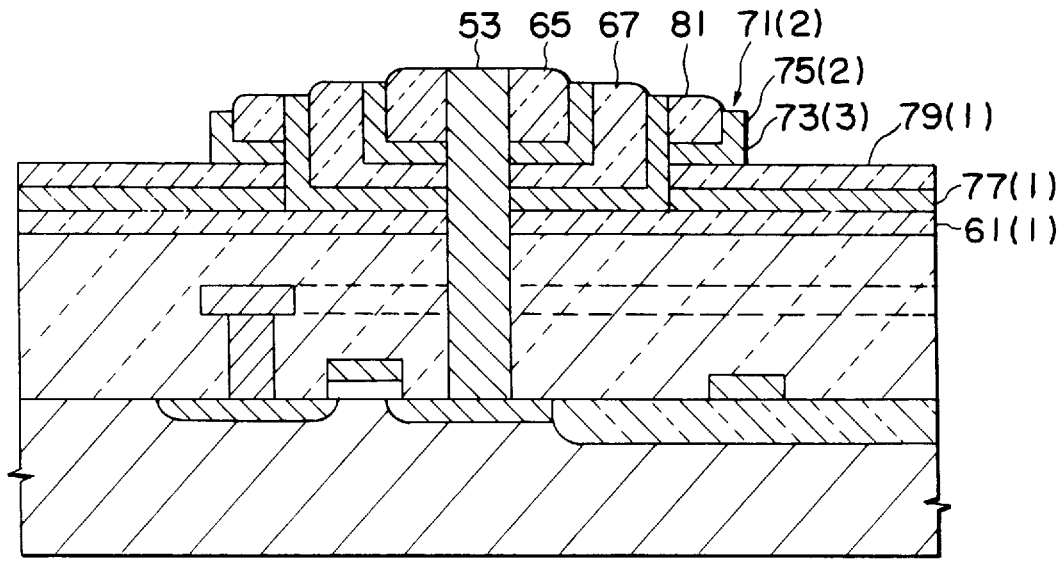
Figure 12C:
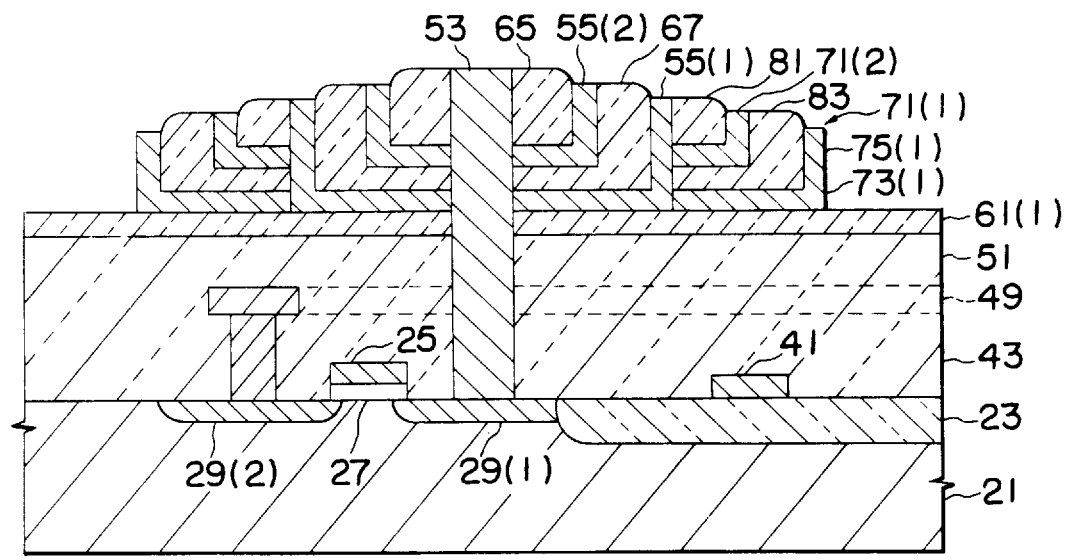

Turning to FIGS. 12(A) to 12(C), still another preferred semiconductor device manufacturing method will be described in order to exemplify later steps of manufacturing the semiconductor device illustrated with reference to FIG. 11. It will be surmised that steps of FIGS. 4(A) to 4(E) were already finished to manufacture the MOS transistor (25, 29), the word and the bit lines 41 and 49, the conductor pole 53, and the first and the second tray-shaped tray conductor layers 55 together with the first and the second spacer blocks 65 and 67 with the first spacer film 61(1) left on the second insulator layer 51. In FIG. 11, the second planar portion 73(2) will be assumed coplanar with the second plate portion 57(2).

In FIG. 12(A), a first additional conductor layer 77(1), an additional spacer film 79(1), a second additional conductor layer 77(2), and a primary additional spacer layer 79(2) were successively formed on the first spacer film 61(1) surrounding the peripheral surface of the first peripheral portion 59(1). Thicknesses of the additional conductor layers 77(1) and 77(2) and the additional spacer film 79(1) were equal to those of the first and the second conductor layers 63(1) and 63(2) and the second spacer film 61(2). The primary additional spacer layer 79(2) had a spacer layer thickness less than a sum of 30 nm and 50 nm.

In FIG. 12(B), the primary additional spacer layer 79(2) were selectively etched to leave on the second additional conductor layer 77(2) in contact with the peripheral surface a first additional spacer block or ring 81 having a first additional block surface parallel to the peripheral surface. In contact with the first additional spacer block surface and in integral contact with the second additional conductor layer 77(2), a first additional conductor block was formed. This conductor block and the second additional conductor layer 77(2) were selectively etched to leave the second planar portion 73(2) on the first additional spacer film 79(1) and the second additional portion 75(2) around the first additional spacer block 81. The second additional portion 75(2) has an additional portion surface directed away from the pole axis.

In FIG. 12(C), a secondary additional spacer layer was formed in contact with the additional portion surface and in integral contact with the first additional spacer film 79(1) and was selectively etched to leave on the first additional conductor layer 77(1) in contact with the additional portion surface a second additional spacer block or ring 83 having a second additional block surface parallel to the peripheral surface. In contact with and around the second additional block surface and in integral contact with the first additional conductor layer 77(1), a second additional conductor block was formed. Selectively etching the second additional conductor block and the first additional conductor layer 77(1), the first planar portion 73(1) and the first additional portion 75(1) were left on the first spacer film 61(1) in contact with the second additional spacer block 83.

Like in FIG. 4(F), the first and the second spacer blacks 65 and 67, the first and the second additional blocks 81 and 83, and the first spacer film 61(1) were etched away. Collectively as the first capacitor electrode, the conductor pole 53, the first and the second tray-shaped tray conductor layers 55(1) and 55(2), and the first and the second tray-shaped additional conductor layers 71(1) and 72(2) were left on the second insulator layer 51 reaching the source electrode 29(1). It is now possible to deposit the capacitor dielectric film 37 on exposed surfaces of the first capacitor electrode and then the second capacitor layer 39 on the capacitor dielectric film 37.

While the semiconductor devices of a few preferred embodiments have thus far been described above together with the preferred semiconductor device manufacturing methods, it will now be readily possible for one skilled in the art to carry this invention into effect in various other manners. The planar conductor layer 69 should be circular in shape and be concentrically held on the pole end with the pole axis passing through a center of this circular shape when the tray-shaped conductor layer or layers 55 are circular in plan. In FIG. 11, the first additional portion 75(1) may be extended a substantially zero length from the first planar portion periphery towards the pole end. In this event, it is unneccessary in FIG. 12(C) to form the second additional conductor block.

What is claimed is:

1. A method of manufacturing a semiconductor device comprising a capacitor which comprises a first capacitor electrode and a second capacitor electrode with a capacitor dielectric film interposed, comprising the steps of:

forming a stack of a spacer film and a conductor layer on an insulator layer covering a principal surface of a semiconductor substrate;

forming a spacer layer on said conductor layer;

forming through said spacer layer, said conductor layer, said spacer film, and said insulator layer a conductor pole having a lengthwise pole axis, a pole end and a peripheral surface;

forming an overlying layer of a conductor on said pole end;

patterning said overlying layer into a planar conductor layer to make said first capacitor electrode further comprise said planar conductor layer;

selectively etching said spacer layer to leave on said conductor layer a spacer block having a block surface parallel to said pole axis;

forming a conductor block in contact with said block surface and said conductor layer;

selectively etching said conductor block and said conductor layer to leave a plate portion and peripheral portion; and selectively etching away said spacer block and said spacer film to leave said conductor pole, said plate portion, and said peripheral portion collectively as said first capacitor electrode.

2. A method of manufacturing a semiconductor device comprising a capacitor which comprises a first capacitor electrode and a second capacitor electrode with a capacitor dielectric film interposed, comprising the steps of:

forming successive stacks of films and layers as at least a first stack of a first spacer film and a first conductor layer on an insulator layer covering a principal surface of a semiconductor substrate and a second stack of a second spacer film and a second conductor layer on said first stack;

forming a spacer layer on said second conductor layer;

forming through said spacer layer, said second conductor layer, said second spacer film, said first conductor layer, said first spacer film, and said insulator layer a conductor pole having a lengthwise pole axis, a pole end and a peripheral surface;

selectively etching said spacer layer to leave on said second conductor layer a first spacer block having a first spacer block surface parallel to said pole axis;

forming a first conductor block in contact with said first spacer block surface and said second conductor layer;

selectively etching said first conductor block and said second conductor layer to leave on said second spacer film a primary plate portion and a primary peripheral portion having a primary periphery parallel to said pole axis;

forming an additional spacer layer in contact with said primary periphery and said second spacer film;

selectively etching said additional spacer layer and said second spacer film to leave on said first conductor layer a second spacer block having a second spacer block surface parallel to said pole axis;

forming a second conductor block in contact with said second spacer block surface and said first conductor layer;

selectively etching said second conductor block and said first conductor layer to leave on said first spacer film a secondary plate portion wider than said primary plate portion and a secondary peripheral portion having a peripheral surface parallel to said pole axis; and selectively etching away said first and said second spacer blocks and said first spacer film to leave said conductor pole, said primary and said secondary plate portions, and said primary and said secondary peripheral portions collectively as said first capacitor electrode.

3. A method as claimed in claim 2, further comprising, between the step of forming said conductor pole and the step of selectively etching said spacer layer to leave said first spacer block, the steps of:

forming an overlying layer of a conductor on said pole end; and patterning said overlying layer into a planar conductor layer to make said first capacitor electrode further comprise said planar conductor layer.

4. A method as claimed in claim 2, further comprising, before the step of selectively etching away said first and second spacer blocks and said first spacer film, the steps of:

forming around said peripheral surface on said first spacer film successively a first additional conductor layer, an additional spacer film, a second additional conductor layer, and a primary additional spacer layer;

selectively etching said primary additional spacer layer to leave on said second additional conductor layer in contact with said peripheral surface a first additional spacer block having a first additional spacer block surface parallel to said pole axis;

forming in contact with said first additional spacer block surface and said second additional conductor layer a first additional conductor block;

selectively etching said first additional conductor block and said second additional conductor layer to leave on said additional spacer film a primary planar portion and a primary additional portion having a primary additional portion periphery parallel to said pole axis;

forming a secondary additional spacer layer in contact with said primary additional portion periphery and said additional spacer film;

selectively etching said secondary additional spacer layer to leave on said first additional conductor layer in contact with said primary additional portion periphery a second additional spacer block having a second additional spacer block surface parallel to said pole axis;

forming in contact with said second additional spacer block surface and said first additional conductor layer a second additional conductor block; and selectively etching said second additional conductor block and said first additional conductor layer to leave on said first spacer film a secondary planar portion and a secondary additional portion having a secondary additional portion periphery parallel to said pole axis; and wherein the step of selectively etching away said first and second spacer blocks and said first spacer film comprises: selectively etching away said first and said second spacer blocks, said first and said second additional spacer blocks, and said first spacer film to leave said conductor pole, said primary and said secondary plate portions, said primary and said secondary peripheral portions, said primary and said secondary planar portions, and said primary and said secondary additional portions collectively as said first capacitor electrode.

5. A method as claimed in claim 4, further comprising, between the step of forming said conductor pole and the step of selectively etching said spacer layer to leave said first spacer block, the steps of:

forming an overlying layer of a conductor on said pole end; and patterning said overlying layer into a planar conductor layer to make said first capacitor electrode further comprise said planar conductor layer.

* * * * *

UNITED STATES PATENT AND TRADEMARK OFFICE
CERTIFICATE OF CORRECTION

PATENT NO. : 5,837,594
DATED : November 17, 1998
INVENTOR(S) : Ichiroh HONMA, et al.

It is certified that error appears in the above-identified patent and that said Letters Patent is hereby corrected as shown below:

On the title page item [30], should read --254104 / 1995--.

Signed and Sealed this

Seventeenth Day of August, 1999

Attest:

Q. TODD DICKINSON

Attesting Officer     Acting Commissioner of Patents and Trademarks